United States Patent
Yang et al.

(10) Patent No.: US 6,921,183 B2
(45) Date of Patent: Jul. 26, 2005

(54) CONCAVE CUP PRINTED CIRCUIT BOARD FOR LIGHT EMITTING DIODE AND METHOD FOR PRODUCING THE SAME

(75) Inventors: Pi-Fu Yang, Keelung (TW); Jit Seang Tan, Penang (MY)

(73) Assignee: Pi Fu Yang, Keelung (TW)

( * ) Notice: Subject to any disclaimer, the term of this patent is extended or adjusted under 35 U.S.C. 154(b) by 116 days.

(21) Appl. No.: 10/366,745

(22) Filed: Feb. 14, 2003

(65) Prior Publication Data

US 2004/0160771 A1 Aug. 19, 2004

(51) Int. Cl.$^7$ .................................................. F21V 7/00
(52) U.S. Cl. ........................ 362/241; 362/800; 362/249; 362/247; 257/E33.066; 313/500
(58) Field of Search ................... 362/235, 249, 362/252, 800, 247, 241, 237; 340/815.31, 815.42, 815.45; 345/82; 40/452, 547; 313/500, 512; 257/E33.067, E25.02, E33.06

(56) References Cited

U.S. PATENT DOCUMENTS

| | | |
|---|---|---|
| 5,043,716 A | 8/1991 | Latz et al. |
| 5,119,174 A | 6/1992 | Chen |
| 5,226,723 A | 7/1993 | Chen |
| 5,371,434 A * | 12/1994 | Rawlings .................... 313/506 |
| 6,225,139 B1 | 5/2001 | Tsung-Wen |
| 6,274,890 B1 * | 8/2001 | Oshio et al. ................... 257/98 |
| 6,614,058 B2 * | 9/2003 | Lin et al. ...................... 257/99 |

FOREIGN PATENT DOCUMENTS

| | | |
|---|---|---|
| EP | 0303741 | 2/1989 |
| EP | 0921568 | 6/1999 |

* cited by examiner

Primary Examiner—Thomas M. Sember
(74) Attorney, Agent, or Firm—Ladas & Parry LLP

(57) ABSTRACT

A concave cup printed circuit board includes a substrate and a cup forming plate. The substrate has an electrical circuitry and at least one contact pad connected to the circuitry. The cup forming plate has at least one through-hole and at least one cup-shaped wall confining the through-hole. The cup forming plate overlies and is connected to the substrate such that the through-hole is disposed over the contact pad. The cup forming plate and the substrate are fabricated separately. The through-hole is formed in the cup forming plate before the cup forming plate is connected to the substrate.

17 Claims, 5 Drawing Sheets

CONCAVE CUP PRINTED CIRCUIT BOARD FOR LIGHT EMITTING DIODE AND METHOD FOR PRODUCING THE SAME

BACKGROUND OF THE INVENTION

1. Field of the Invention

The invention relates to a printed circuit board (PCB) for a light emitting diode (LED) and a method for producing the same, more particularly to a concave cup PCB for the LED and a method for producing the same.

2. Description of the Related Art

Referring to FIG. 1, a conventional round concave cup PCB for the LED primarily includes a substrate 11, a plurality of round concave cups 12 formed in the substrate 11, and a plurality of conductive foils 13 mounted on the substrate 11. The method for producing the conventional round concave cup PCB includes the steps of forming a plurality of round concave cups 12 on a surface of the substrate 11, and mounting the conductive foils 13 on the surface of the substrate 11 so as to produce the round concave cup PCB.

The round concave cup PCB can be further processed to produce the LED. Referring to FIG. 2, a diode die 14 is fixed on a flat bottom of each of the round concave cups 12 by adhesive dispensing, and the dies 14 and the conductive foils 13 are electrically connected through conductive wires 15 by wire bonding. Finally, a packing layer 16 of an epoxy resin is formed on the substrate 11 so as to conceal the dies 14, conductive foils 13 and conductive wires 15 therebeneath and to produce the LED product.

It is known that the aforesaid LED product has a better heat dissipation because the dies 14 are directly buried into the round concave cup PCB that has the advantage of good heat dissipation. In addition, the LED product also has better control in light amplifying ratio and better effect in light mixing because the dies 14 of different colors can be implanted into the round concave cup PCB.

However, one of the main disadvantages of the prior art resides in that it involves a lengthy and complex manufacturing process. Furthermore, due to the involvement of too many processing steps, the possibility of processing error, which leads to yield loss of the end product, is higher.

In the prior art, the substrate 11 for the round concave cup PCB has to be drilled by computer numerical control (CNC), and then by a special miller cutter having a tip of a concave cup configuration to mill the round concave cups 12. After the completion of drilling and milling, the substrate 11 has to be polished, and numerous plating processes (such as copper plating and nickel plating) are then conducted in order to create the reflective concave cup wall and the necessary electrical traces and contacts. In summary, more than twenty steps are involved in the manufacturing process of the prior art. The drilling and milling steps are very tedious and expensive, and any error caused by the drilling step will affect the overall performance of the round concave cup PCB. Moreover, the miller cutter is easily worn off, and has to be replaced periodically because a worn cutter will not produce a smooth cup wall. The uniformity of light reflection can be negatively affected if the round concave cup PCB without a smooth cup wall is subsequently plated with metal coatings. Furthermore, the cost of the cutter and the down time of the machine will incur extra costs in the manufacturing process of the prior art.

SUMMARY OF THE INVENTION

Therefore, the object of the present invention is to provide a concave cup printed circuit board and a method for producing the same, which can reduce yield loss, which can be mass produced, and which can reduce the thickness of the product.

According to one aspect of this invention, a concave cup printed circuit board includes a substrate and a cup forming plate. The substrate has an electrical circuitry and at least one contact pad connected to the circuitry. The cup forming plate has at least one through-hole and at least one cup-shaped wall confining the through-hole. The cup forming plate overlies and is connected to the substrate. The through-hole is disposed over the contact pad. The cup forming plate and the substrate are fabricated separately. The through-hole is formed in the cup forming plate before the cup forming plate is connected to the substrate.

In another aspect of this invention, a method for producing a concave cup printed circuit board includes the steps of:

fabricating a substrate having an electrical circuitry including at least one contact pad;

preparing a cup forming plate which includes at least one through-hole and at least one cup-shaped wall confining the through-hole; and overlying and connecting the cup forming plate to the substrate such that the through-hole is disposed over the contact pad.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
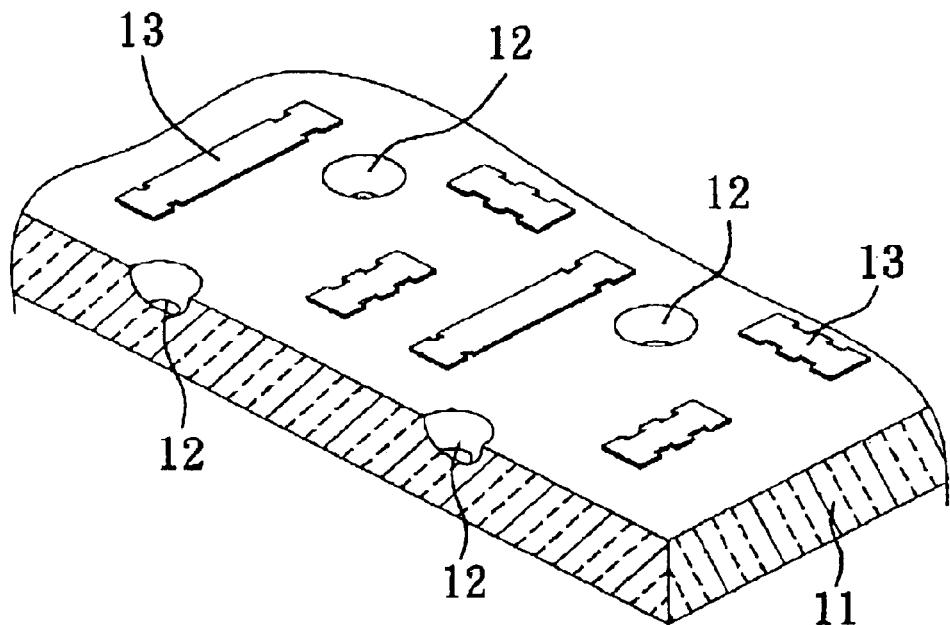
FIG. 1 is a fragmentary perspective view of a conventional round concave cup PCB for LEDs.
Figure 2:
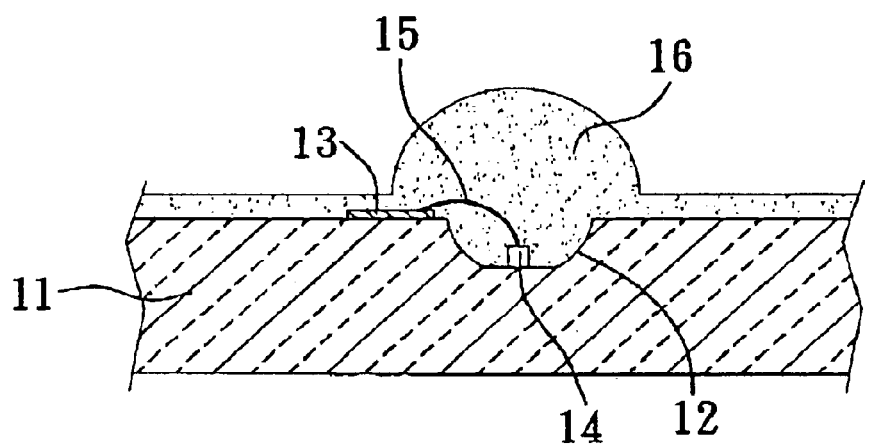
FIG. 2 is a fragmentary sectional view, of the conventional round concave cup PCB including the LED die.
Figure 3:
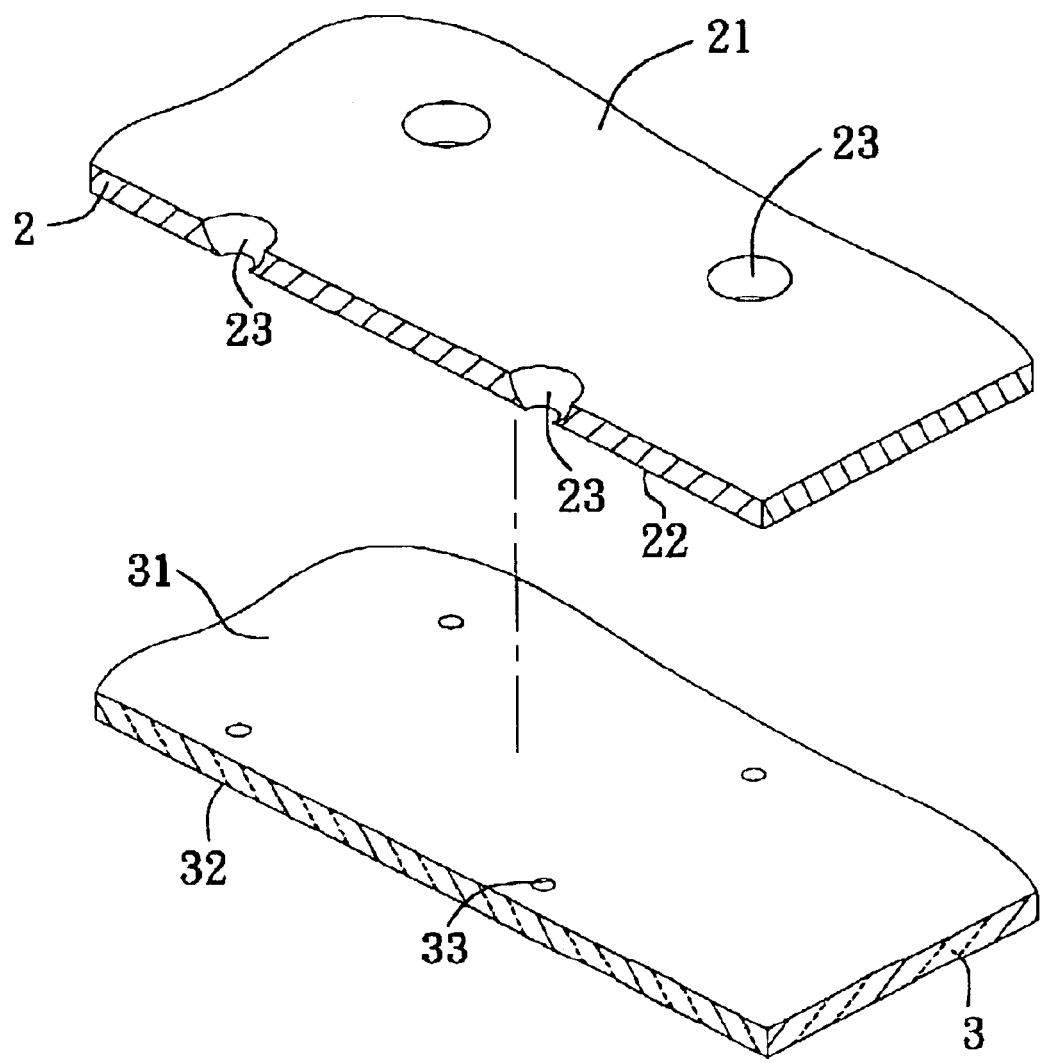
FIG. 3 is an exploded fragmentary perspective view of the first preferred embodiment of a concave cup printed circuit board according to this invention.
Figure 4:
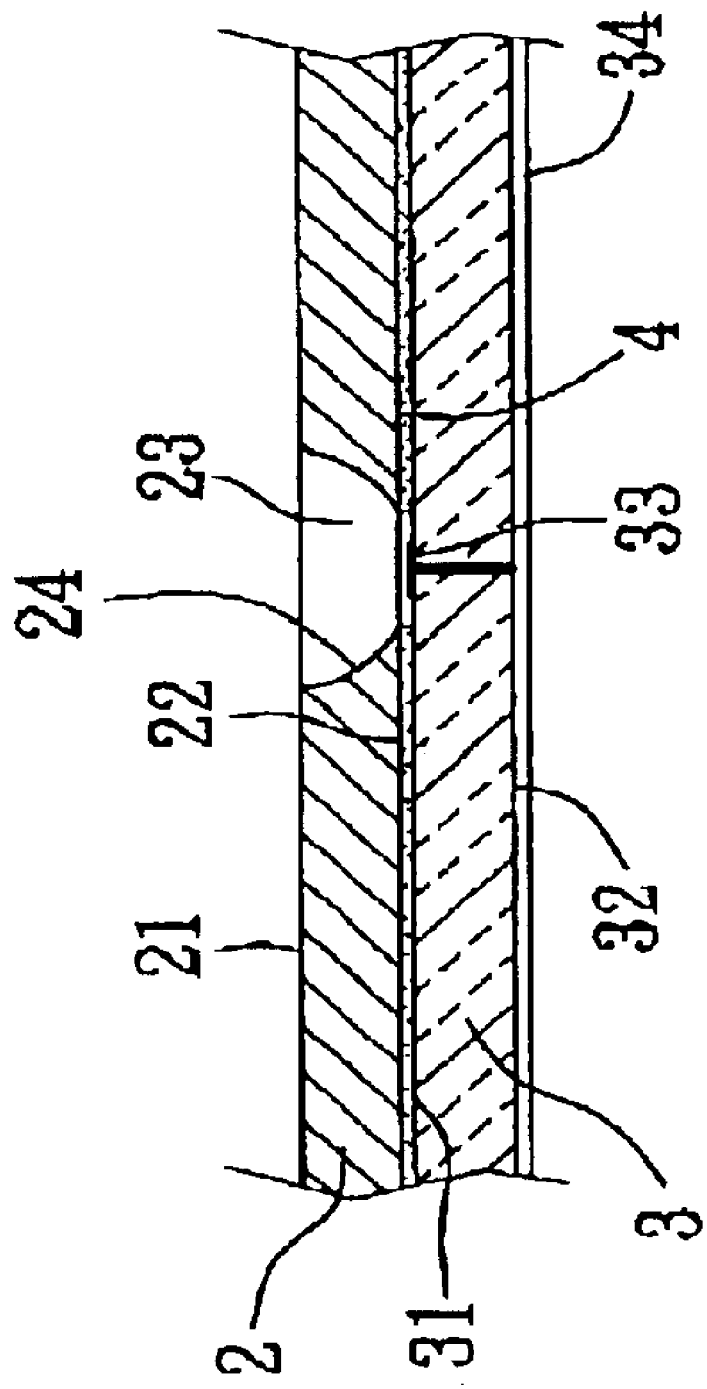
FIG. 4 is a fragmentary sectional view of the first preferred embodiment.
Figure 6:
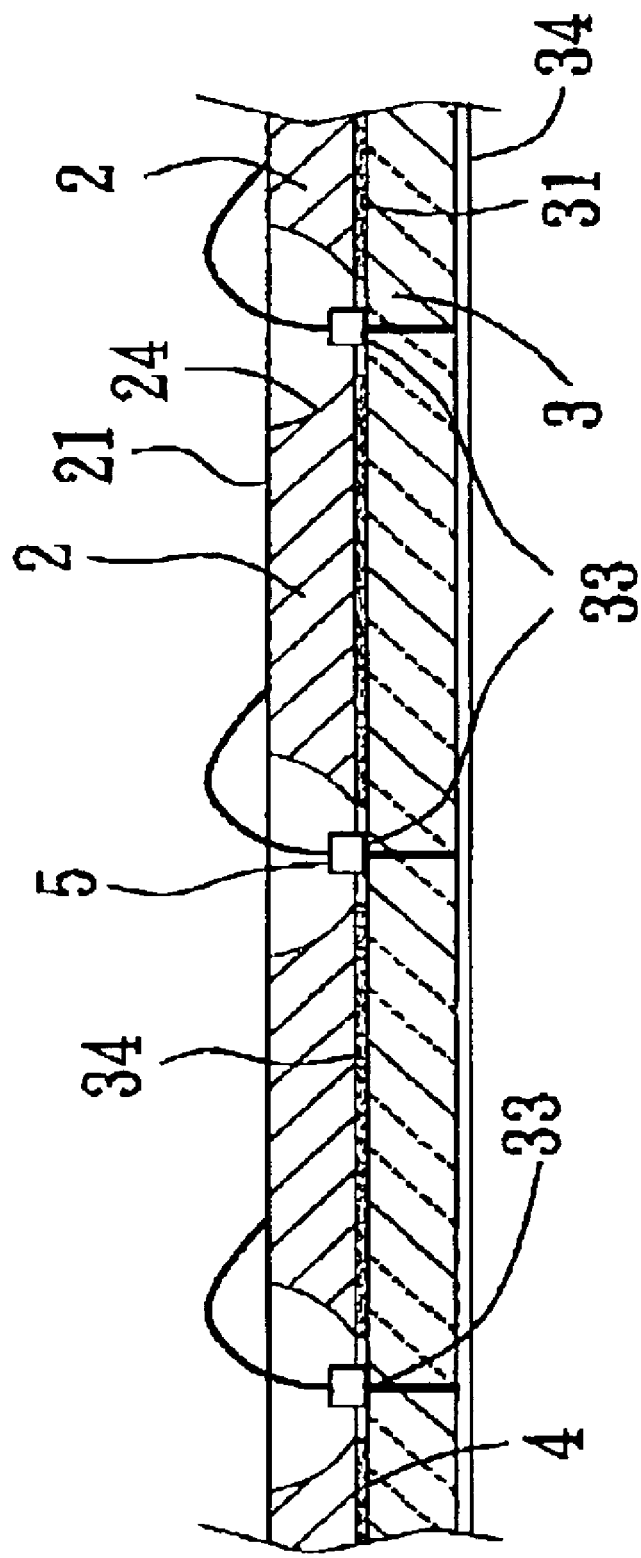
FIG. 6 is a fragmentary sectional view of the preferred embodiment including LED dies fixed thereon.

Referring to FIGS. 3, 4 and 6, the first preferred embodiment of a concave cup printed circuit board according to this invention is shown to include a substrate 3, a cup forming plate 2, and an adhesive layer 4 disposed between the substrate 3 and the cup forming plate 2. Depending on the design of the LED product, the adhesive layer 4 can be an electrically conductive adhesive layer. The concave cup printed circuit board is adapted for fixing LED dies 5 thereon.

The substrate 3 has a top surface 31 adjacent to the cup forming plate 2, and a bottom surface 32 opposite to the top surface 31, and includes an electrical circuitry 34 formed on the bottom surface 32 and an array of contact pads 33 disposed on the top surface 31 and connected to the circuitry 34.

The cup forming plate 2 has a plurality of through-holes 23 and cup-shaped walls 24 respectively confining the through-holes 23. The cup forming plate overlies and is connected to the substrate 3. The through-holes 23 are arranged in an array corresponding to the array of the contact pads 33 in a one-to-one relationship. Accordingly, each of the through-holes 23 is disposed over each of the contact pads 33. Alternatively, the through-holes 23 can also be arranged in an array corresponding to the array of the contact pads 33 in a one-to-many relationship. In other words, each of the through-holes 23 can be disposed over more than one of the contact pads 33. The cup forming plate 2 has a first surface 22 adjacent to the substrate 3 and a second surface 21 opposite to the first surface 22. Each cup-shaped wall 24 is rounded and has a cross-section which is gradually enlarged from the first surface 22 to the second surface 21. Each of the cup-shaped walls 24 cooperates with a corresponding portion of the top surface 31 of the substrate 3 to define a receiving space with a flat bottom for receiving at least one of the LED dies 5 within the receiving space. Therefore, the LED dies 5 are respectively disposed within the through holes 23, and are connected electrically to the contact pads 33.

The cup forming plate 2 and the substrate 3 are fabricated separately. The through-holes 23 are formed in the cup forming plate 2 before the cup forming plate 2 is connected to the substrate 3.

Figure 5:
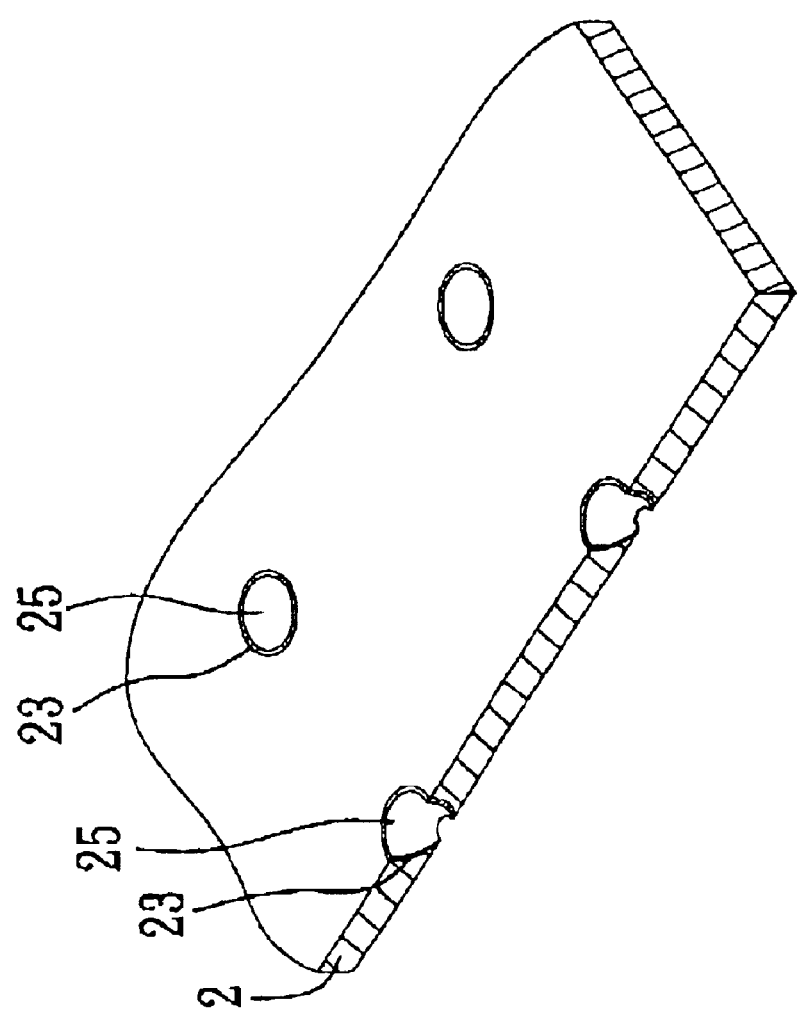
FIG. 5 is a fragmentary perspective view of a cup forming plate of the second preferred embodiment of a concave cup printed circuit board according to this invention.

Referring to FIG. 5, the second preferred embodiment of the concave cup printed circuit board according to this invention is shown to further include a reflective layer 25 around each of the through-holes 23 of the cup forming plate 2.

In the method for producing the concave cup printed circuit board, the substrate 3 is first fabricated, the cup forming plate 2 is then prepared, and the cup forming plate 2 is finally overlaid and connected to the substrate 3 such that the through-holes 23 are disposed over the contact pads 33.

The cup forming plate 2 can be fabricated by a molding process or a mechanical shaping process, such as a forging process.

In the molding process, the material for the cup forming plate 2 is a conductive material, such as conductive plastic (for example, metal epoxy). A precision molding tool is designed to produce the required concave cup dimensions and the precise light guiding angle of the cup forming plate 2. The molding tool is further attached to a molding machine, which is capable of producing the desired quality and quantity of the through-holes 23 and the cup-shaped walls 24 with a high production rate. The cup forming plate 2 can be mass-produced at a relatively low cost by the molding process. The conductive material and other molding additives (such as, accelerators, curing agents, fillers and mold release agents, and the like) as well as the composition and characteristic requirements thereof can be properly selected by one skilled in the art. Furthermore, the processing parameters, such as flow rate, injection pressure, process temperature, and the like, are also well known in the art and can be properly selected in the practice of this invention.

In the mechanical shaping process, such as forging process, the cup forming plate 2 can be forged from a conductive metal sheet, for example a reflective metal sheet, such as a gold sheet or a silver sheet. The forging process utilizes a high precision die and forging tools, which are attached to a forging machine capable of producing the required precise dimensions and light guiding angle of the cup-shaped walls 24. This method offers the same advantages as the aforesaid molding process because the mechanical shaping process has the same capability as the molding process in terms of cost and processing capability establishment. In addition, the process can be fully automated in order to be suited for mass production.

Since both the molding process and the mechanical shaping process do not use the drilling and milling processes as required by the prior art, the aforesaid disadvantages suffered in the prior art can be overcome.

The substrate 3 can be a conventional flat PCB or a flexible PCB. The method for producing the PCB is conducted according to the general PCB production method. Some of the material commonly used for the flat PCB is FR4 or FR5. The production process includes the fabrication of the necessary electrical circuitry 34 and contact pads 33 in order to provide electrical connection to the LED dies 5. The electrical circuitry 34 can be formed on the top surface 31 or the bottom surface 32 of the substrate 3. The electrical circuitry 34 can also be embedded in the substrate 3, such as in a multi-layer PCB. In the preferred embodiment (best shown in FIG. 6), the electrical circuitry 34 is formed on the bottom surface 32 of the substrate 3. One or more insulating layers (not shown) can be mounted, if desired. Since there is no need to provide extra thickness on the PCB for accommodating the concave cups, the thickness of the PCB in the present method can be substantially reduced.

After the cup forming plate 2 and the substrate 3 are fabricated separately, the cup forming plate 2 is then overlaid and connected to the substrate 3 by an adhesive bonding process. The adhesive bonding process can be conducted using a conductive material. The bonding methodology and the steps thereof are dependent on adhesive material application requirements, adhesive material characteristics, application process parameters, and the like. For example, for certain adhesive materials, the dispensing method, the amount of the adhesive material, the pre-treatment and the post-treatment to the cup forming-plate 2 and the substrate 3, and the curing and baking process are all dependent on the adhesive material and the application method thereof.

Referring again to FIG. 5, in the second preferred embodiment of this invention, the fabricated cup forming plate 2 can be further provided with a reflective coating 25 (such as, a silver or gold coating) over each of the cup-shaped walls 24 so as to further improve the reflectivity of the cup-shaped walls 24. The reflective coating 25 can be deposited onto the cup-shaped walls 24 using deposition techniques, such as physical vapor deposition (PVD), chemical vapor deposition (CVD), or plasma coating. One of the most common methods to apply the reflective coating 25 onto the cup forming plate 2 is a vacuum metallizing method in which the cup forming plate 2 is placed in a vacuum chamber, and the coating material for the reflective coating 25 (such as, silver powder) is deposited onto the cup-shaped walls 24 of the cup forming plate 2. The cup forming plate 2 has to be masked so that only the cup-shaped walls 24 are exposed to the material of the reflective coating 25.

Referring again to FIG. 6, after the concave cup printed circuit board of this invention is fabricated, the LED dies 5 can be disposed within the through holes 23 and can be connected electrically to the contact pads 33 by a general LED die attaching process.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A concave cup printed circuit board comprising:
   a substrate including an electrical circuitry and at least one contact pad connected to said circuitry;
   a cup forming plate having at least one through-hole and at least one cup-shaped wall confining said through-hole, said cup forming plate overlying and being connected to said substrate, said through-hole being disposed over said contact pad; and
   an electrically conductive adhesive layer disposed between said cup forming plate and said substrate;
   wherein said cup forming plate and said substrate are fabricated separately, and said through-hole is formed in said cup forming plate before said cup forming plate is connected to said substrate.

2. The concave cup printed circuit board as claimed in claim 1, wherein said substrate has en army of said contact pads connected to said electrical circuitry, and said cup forming plate has a plurality of said through-holes and a plurality of said cup-shaped walls.

3. The concave cup printed circuit board as claimed in 2, wherein said through-holes are arranged in an array corresponding to said array of said contact pads, each of said through-holes being disposed over one of said contact pads.

4. The concave cup printed circuit board as claimed in claim 1, wherein said cup forming plate includes a reflective layer around said through-hole.

5. The concave cup printed circuit board as claimed in claim 1, wherein said cup forming plate is made of a conductive material.

6. The concave cup printed circuit board as claimed in claim 5, wherein said conductive material is a conductive plastic.

7. The concave cup printed circuit board as claimed in claim 5, wherein said conductive material is a metal.

8. The concave cup printed circuit board as claimed in claim 1, further comprising a diode die disposed within said through-hole and connected electrically to said contact pad.

9. The concave cup printed circuit board as claimed in claim 1, wherein said cup forming plate has a first surface adjacent to said substrate and a second surface opposite to said first surface, said cup-shaped wall being rounded and having a cross-section which is gradually enlarged from said first surface to said second surface.

10. The concave cup printed circuit board as claimed in claim 1, wherein said substrate has a top surface adjacent to said cup forming plate, and a bottom surface opposite to said top surface, said circuitry being formed on said bottom surface, said contact pad being disposed on said top surface, said cup forming plate being electrically conductive.

11. The concave cup printed circuit board as claimed in claim 10, further comprising a diode die disposed within said through-hole and connected electrically to said contact pad.

12. A method for producing a concave cup printed circuit board, comprising:
   fabricating a substrate having an electrical circuitry including at least one contact pad;
   preparing a cup forming plate which includes at least one through-hole and at least one cup-shaped wall confining said through-hole;
   disposing said cup forming plate on said substrate such that said through-hole is disposed over said contact pad; and
   providing an electrically conductive adhesive layer between said cup forming plate and said substrate to connect said cup forming plate to said substrate.

13. The method as claimed in claim 12, further comprising attaching a diode die to said contact pad.

14. The method as claimed in claim 12, wherein said cup-forming plate is made by molding a plastic material.

15. The method as claimed in claim 12, further comprising providing a reflective coating over said cup-shaped wall.

16. The method as claimed in claim 12, wherein said cup-forming plate is made by forming a metal plate.

17. The method as claimed in claim 12, wherein the forming of said metal plate is carried out by a forging process.

* * * * *